(12) United States Patent
Kumar et al.

(10) Patent No.: US 9,991,167 B2
(45) Date of Patent: Jun. 5, 2018

(54) METHOD AND IC STRUCTURE FOR INCREASING PITCH BETWEEN GATES

(71) Applicant: GLOBALFOUNDRIES INC., Grand Cayman (KY)

(72) Inventors: Arvind Kumar, Beacon, NY (US); Murshed M. Chowdhury, Fremont, CA (US); Brian J. Greene, Wappingers Falls, NY (US); Chung-Hsun Lin, Yorktown Heights, NY (US)

(73) Assignee: GLOBALFOUNDRIES INC., Grand Cayman (KY)

( * ) Notice: Subject to any disclaimer, the term of this patent is extended or adjusted under 35 U.S.C. 154(b) by 0 days. days.

(21) Appl. No.: 15/085,077

(22) Filed: Mar. 30, 2016

(65) Prior Publication Data
US 2017/0287829 A1      Oct. 5, 2017

(51) Int. Cl.
| H01L 21/8234 | (2006.01) |
| H01L 29/66 | (2006.01) |
| H01L 29/08 | (2006.01) |
| H01L 29/161 | (2006.01) |
| H01L 29/78 | (2006.01) |
| H01L 27/088 | (2006.01) |
| H01L 29/40 | (2006.01) |

(52) U.S. Cl.
CPC ........ *H01L 21/823425* (2013.01); *H01L 21/823437* (2013.01); *H01L 27/088* (2013.01); *H01L 29/0847* (2013.01); *H01L 29/161* (2013.01); *H01L 29/401* (2013.01); *H01L 29/66545* (2013.01); *H01L 29/7848* (2013.01); *H01L 2924/381* (2013.01)

(58) Field of Classification Search
CPC .......... H01L 27/088; H01L 29/66545; H01L 29/7843
See application file for complete search history.

(56) References Cited

U.S. PATENT DOCUMENTS

| 5,563,012 | A | 10/1996 | Neisser |
| 5,636,158 | A | 6/1997 | Kato et al. |
| 5,759,744 | A | 6/1998 | Brueck et al. |
| 6,541,166 | B2 | 4/2003 | Mansfield et al. |
| 6,621,132 | B2 | 9/2003 | Onishi et al. |
| 7,368,225 | B1 | 5/2008 | Subramanian et al. |
| 7,682,757 | B2 | 3/2010 | Mashita et al. |
| 7,851,849 | B2 | 12/2010 | Kiyotoshi |
| 8,158,306 | B2 | 4/2012 | Chen et al. |
| 8,530,145 | B2 | 9/2013 | Hagiwara |
| 8,667,432 | B2 | 3/2014 | Blatchford et al. |

(Continued)

*Primary Examiner* — Daniel Luke
(74) *Attorney, Agent, or Firm* — Yuanmin Cai; Hoffman Warnick LLC

(57) ABSTRACT

Aspects of the present disclosure include integrated circuit (IC) structure and methods for increasing a pitch between gates. Methods according to the present disclosure can include: providing an IC structure including: a first gate structure and a second gate structure each positioned on a substrate, a dummy gate positioned between the first and second gate structures, and forming a mask over the first and second gate structures; and selectively etching the dummy gate from the IC structure to expose a portion of the substrate underneath the dummy gate of the IC structure, without affecting the first and second gate structures.

18 Claims, 7 Drawing Sheets

(56) References Cited

U.S. PATENT DOCUMENTS

| | | | | |
|---|---|---|---|---|
| 8,722,485 | B1* | 5/2014 | Tong | H01L 29/513 |
| | | | | 257/E21.625 |
| 9,543,435 | B1* | 1/2017 | Basker | H01L 29/7835 |
| 2003/0219953 | A1* | 11/2003 | Mayuzumi | H01L 21/82345 |
| | | | | 438/353 |
| 2010/0237435 | A1* | 9/2010 | Chudzik | H01L 21/823437 |
| | | | | 257/380 |
| 2011/0115000 | A1* | 5/2011 | Yang | H01L 21/823807 |
| | | | | 257/288 |
| 2012/0248509 | A1* | 10/2012 | Guo | H01L 29/4966 |
| | | | | 257/288 |
| 2013/0260516 | A1* | 10/2013 | Chang | H01L 21/823437 |
| | | | | 438/151 |
| 2014/0027820 | A1* | 1/2014 | Aquilino | H01L 21/76232 |
| | | | | 257/288 |

* cited by examiner

METHOD AND IC STRUCTURE FOR INCREASING PITCH BETWEEN GATES

TECHNICAL FIELD

The present disclosure relates to increasing the pitch, a measure of separation distance, between adjacent gates in an integrated circuit (IC). More specifically, embodiments of the present disclosure relate to methods of increasing the pitch between two gates, and IC structures exhibiting structural features related to the increased pitch.

BACKGROUND

In integrated circuit (IC) structures, a transistor is a critical component for implementing digital circuitry designs. Generally, a transistor includes three electrical terminals: a source, a drain, and a gate. By applying different voltages to the gate terminal, the flow of electric current between the source and the drain can be turned on and off. A gate structure, which may include conductive materials such as metals, can be formed over a semiconductor portion of the transistor structure to govern the operation of the transistor. By applying a voltage to the gate structure, an electrically conductive channel can be created between the source and drain terminals of the portion of semiconductor material positioned in contact with the gate.

Pitch is a quantity which measures the amount of separation between two features. A value of "pitch" specifies a sum of the width of a feature (e.g., a transistor gate) and the space on one side of the feature separating that feature from a neighboring feature. Depending on the photolithographic process being used, factors such as optics and wavelengths of light or radiation restrict how small the pitch can be before features can no longer be reliably printed to a wafer or mask. As such, the pitch limits the smallest size of any features that can be created on a wafer. Various changes and improvements to IC fabrication, over time, have accommodated progressive reductions in pitch to provide greater component densities and greater operational sophistication in an IC product. In some portions of an IC, however, the reduced pitch may be associated with unanticipated changes in electrical behavior such as shorting and/or general changes in threshold voltage, current, etc. Although techniques for selective fabrication to provide a larger pitch between elements are possible, their implementation can also introduce additional steps to otherwise streamlined processes of forming transistor elements at particular locations.

BRIEF SUMMARY

A first embodiment of the present disclosure provides a method for increasing a pitch between gates, the method comprising: providing an IC structure including: a first gate structure and a second gate structure each positioned on a substrate, a dummy gate positioned between the first and second gate structures, and forming a mask over the first and second gate structures; and selectively etching the dummy gate from the IC structure to expose a portion of the substrate underneath the dummy gate of the IC structure, without affecting the first and second gate structures.

A second embodiment of the present disclosure provides an integrated circuit (IC) structure comprising: a substrate; a first doped semiconductor region positioned on the substrate; a second doped semiconductor region positioned on the substrate, wherein an insulative gap positioned over an upper surface of the substrate laterally separates the first doped semiconductor region from the second doped semiconductor region; a first gate positioned on the substrate and laterally adjacent to the first doped semiconductor region; and a second gate positioned on the substrate and laterally adjacent to the second doped semiconductor region.

A third embodiment of the present disclosure provides a method for increasing a pitch between gates, the method comprising: forming a first gate, a second gate, and a dummy gate on a substrate, wherein the dummy gate is positioned laterally between the first and second gates; forming a first insulator over the substrate; selectively etching the dummy gate to form a gap; forming a second insulator within the gap; selectively removing the first gate and the second gate from a first gate opening and a second gate opening within the first insulator; forming a first replacement metal gate (RMG) on the first gate opening of the substrate; and forming a second RMG on the second gate opening of the substrate, wherein the gap is positioned laterally between the first RMG and the second RMG.

BRIEF DESCRIPTION OF THE DRAWINGS

These and other features of this disclosure will be more readily understood from the following detailed description of the various aspects of the disclosure taken in conjunction with the accompanying drawings that depict various embodiments of the disclosure, in which.

It is noted that the drawings of the disclosure are not to scale. The drawings are intended to depict only typical aspects of the disclosure, and therefore should not be considered as limiting the scope of the disclosure. In the drawings, like numbering represents like elements between the drawings.

DETAILED DESCRIPTION

Embodiments of the present disclosure provide methods for increasing an amount of pitch between two gates of an IC structure, by combining a conventional transistor fabrication process with a process for modifying a partially-fabricated integrated circuit (IC). Methods according to the present disclosure can be performed on an IC structure which includes a first gate structure, a second gate structure, and a dummy gate each positioned on a substrate such that the dummy gate is positioned laterally between the first and second gate structures. To form the increased pitch, embodiments of the present disclosure can include forming a mask over the first and second gate structures, and selectively removing the dummy gate from the IC structure to expose the substrate. The exposed substrate can be positioned at a location which was previously underneath the dummy gate. The initial pitch (a measurement of separation distance) between the dummy gate and each of the two gate structures can be approximately equal to a standard pitch between fabricated gates, e.g., approximately seventy nanometers (nm). Removing the dummy gate between two adjacent gate structures can increase the amount of pitch, e.g., by a multiple of two, which in some embodiments can be approximately one-hundred and forty nm.

Figure 1:
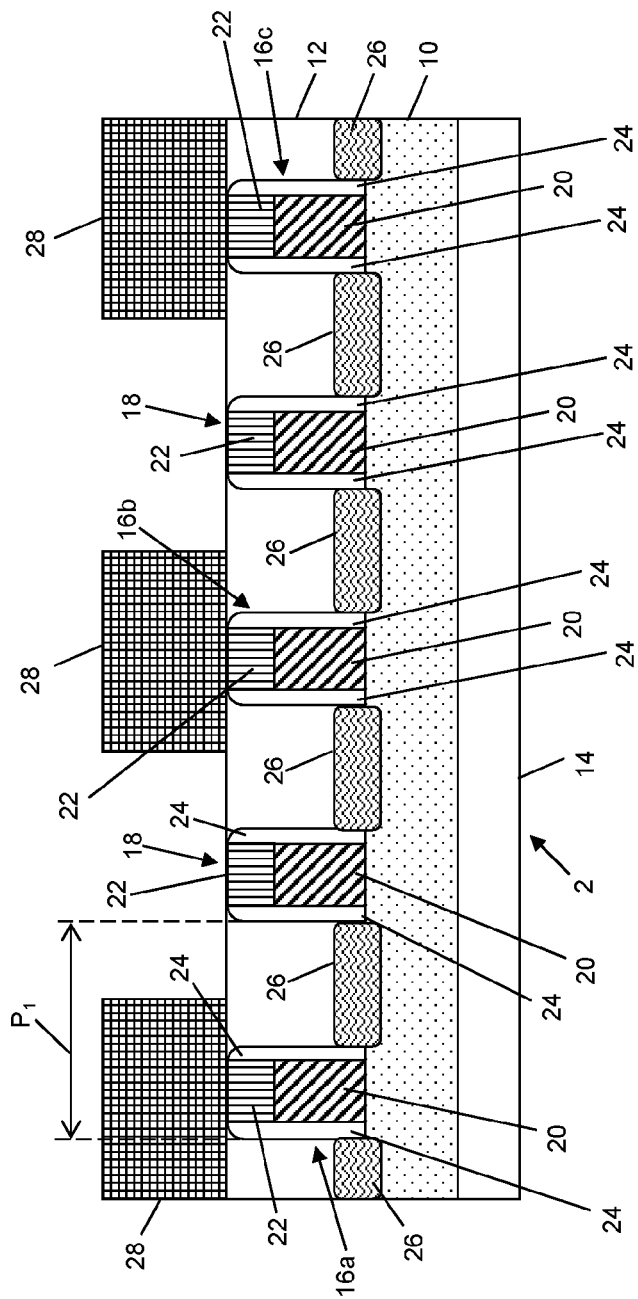
FIG. 1 shows a cross-sectional view of a provided integrated circuit (IC) structure with a set of gates and dummy gates according to embodiments of the present disclosure.

Referring to FIG. 1, a structure 2 used for fabricating an IC according to aspects of the present disclosure is shown. Structure 2 can include a substrate 10. Substrate 10 can be composed of any currently known or later developed semiconductor material, which may include without limitation: silicon, germanium, silicon carbide, and substances consisting essentially of one or more III-V compound semiconductors having a composition defined by the formula $Al_{X1}Ga_{X2}In_{X3}As_{Y1}P_{Y2}N_{Y3}Sb_{Y4}$, where X1, X2, X3, Y1, Y2, Y3, and Y4 represent relative proportions, each greater than or equal to zero and X1+X2+X3+Y1+Y2+Y3+Y4=1 (1 being the total relative mole quantity). Other suitable substances can include II-VI compound semiconductors having a composition $Zn_{A1}Cd_{A2}Se_{B1}Te_{B2}$, where A1, A2, B1, and B2 are relative proportions each greater than or equal to zero and A1+A2+B1+B2=1 (1 being a total mole quantity). Furthermore, the entirety of substrate 10 or a portion thereof may be strained.

A first insulator 12 can be formed on and positioned above substrate 10. First insulator 12 may be composed of any insulating material such as $SiO_2$ or a "low-k" dielectric having a low dielectric constant, which may be, for example, between approximately 3.9 and 7.0. The composition of first insulator 12 can include, e.g., silicon dioxide ($SiO_2$), silicon nitride (SiN), and other currently known or later developed materials having similar electrically insulating properties. In some applications, substrate 10 can be provided as a bulk substrate, silicon on insulator (SOI) substrate, or another type of substrate. Where substrate 10 is provided as an SOT substrate, substrate 10 can be positioned over a buried insulator 14. Buried insulator 14 can be composed of one or more of the example insulating materials discussed herein relative to first insulator 12. Buried insulator 14 can also be generally known as a buried oxide (BOX) layer.

A set of gate structures 16a, 16b, 16c and dummy gates 18 can be formed on substrate 10, e.g., by conventional processes of forming and removing a gate structure on a semiconductor component. Gate structures 16a, 16b, 16c and dummy gates 18, more specifically, can be formed on substrate 10 before the forming of first insulator 12, or can be formed within removed portions of a previously formed first insulator 12. Each gate structure 16a, 16b, 16c can have an initial pitch $P_1$ relative to its adjacent dummy gate 18. In an example embodiment, the size of initial pitch $P_1$ can be approximately seventy nm. The term "pitch" generally refers to the sum of the width of a feature (e.g., gate structure 16a, 16b, 16c) and the space on one side of the feature separating that feature from a neighboring feature (e.g., dummy gate 18). According to one embodiment, gate structures 16a, 16b, 16c, may be formed to have the same or similar structures as dummy gates 18. Similarity in structure between the components may provide one or more technical benefits such as, e.g., simplifying the design and manufacturing processes of an IC product. Nevertheless, embodiments of present disclosure are not limited in this respect and gate structures 16a, 16b, 16c may be formed to have one or more structural properties that are different from dummy gate(s) 18. For example, gate structures 16a, 16b, 16c may be formed to have one or more of their dimensions, subcomponent compositions, etc., different from a corresponding characteristic of dummy gate(s) 18.

Each gate structure 16a, 16b, 16c and dummy gate 18 can include, e.g., a sacrificial material 20 formed on substrate 10, which generally can be composed of polysilicon or amorphous silicon. Although not shown explicitly in FIG. 1, one or more conventional liners can also be formed between insulator 12 and/or sacrificial material 20. Sacrificial material 20 can be formed, e.g., by deposition. The terms "depositing" or "deposition," as used herein may include any now known or later developed techniques appropriate for the material to be deposited including but are not limited to, for example: chemical vapor deposition (CVD), low-pressure CVD (LPCVD), plasma-enhanced CVD (PECVD), semi-atmosphere CVD (SACVD) and high density plasma CVD (HDPCVD), rapid thermal CVD (RTCVD), ultra-high vacuum CVD (UHVCVD), limited reaction processing CVD (LRPCVD), metalorganic CVD (MOCVD), sputtering deposition, ion beam deposition, electron beam deposition, laser assisted deposition, thermal oxidation, thermal nitridation, spin-on methods, physical vapor deposition (PVD), atomic layer deposition (ALD), chemical oxidation, molecular beam epitaxy (MBE), plating, evaporation.

An insulator cap 22 can also be formed on an upper surface of sacrificial material 20 of each gate structure 16a, 16b, 16c and dummy gate 18, e.g., to shield sacrificial material 20 from being affected by processes which selectively form materials on an exposed semiconductor. Insulator cap 22 can be composed of one or more of the dielectric materials described elsewhere herein relative to first insulator 12, or can be composed of a different electrically insulating material. Each gate structure 16 and dummy gate 18 can also include, e.g., a pair of spacers 24 positioned on opposing sidewalls thereof, such that the sidewalls of sacrificial material 20 are protected from processing steps which would affect sacrificial material 20. Spacers 24 can be formed on each gate structure 16a, 16b, 16c and/or dummy gate 18 before first insulator 12 is formed. In any event, each dummy gate 18 can be positioned laterally between two respective gate structures 16a, 16b, 16c.

A group of doped semiconductor regions 26 can be positioned on substrate 10 between laterally adjacent structures, e.g., between one gate structure 16 and one dummy gate 18. Each doped semiconductor region can have substantially the same material composition as substrate 10, but with one or more dopant materials therein. As described herein, "doping" refers to a process by which an impurity or "dopant" is introduced into a semiconductive material to alter its electrical properties, e.g., the conductivity and resistivity of a material. Doped semiconductor regions 26 can be composed of, e.g., silicon (Si) and/or silicon germanium (SiGe) with various dopants materials (e.g., "p-type" or "n-type") therein to provide varying electrical polarities. Regardless of composition, doped semiconductor regions 26 can be formed, e.g., by the application of epitaxy and/or implantation before the forming of first insulator 12. Epitaxy generally refers to a process by which a thin layer of single-crystal material is deposited on single-crystal substrate. Epitaxial growth allows for the crystallographic structure of the substrate to be reproduced in the growing material. Implantation, by contrast, refers to a process in which ions are accelerated toward a solid surface and penetrate the solid up to a predetermined depth, determined by ion energy. Implantation can be distinguished from epitaxial growth in that the material retains its existing dimensions, but portions of the material acquire varying properties as a result of the introduced ions. In addition to doped semiconductor regions 26, it is understood that other regions and/or materials can be formed within substrate 10, e.g., shallow trench isolations (STIs) including one or more regions of insulated material positioned within substrate 10.

Processes of the present disclosure can include forming one or more first masks 28 on each gate structure 16a, 16b, 16c, while leaving dummy gates 18 exposed on an upper surface of IC structure 2. First mask(s) 28 can be provided as a group of separate structures, or as a larger interconnected structure which can extend laterally into or out of the plane of the page. Forming first mask(s) 28 over each gate structure 16a, 16b, 16c, can protect the components thereof from being affected in subsequent process steps. In embodiments where dummy gates 18 are structurally similar or identical to gate structures 16a, 16b, 16c, first mask(s) 28 can preserve each gate structure 16a, 16b, 16c for later use as an operational gate or for later removal in a gate replacement process. First mask 28 can be composed wholly or partially of, e.g., one or more low-temperature oxides (LTOs), $SiO_x$ compounds, and/or $Si_xN_y$ compounds. In an example embodiment, first mask(s) 28 can also be provided in the form of, e.g., titanium nitride, silicon nitride, and/or any other currently known or later developed materials suitable for use as a hard masking material.

Figure 2:
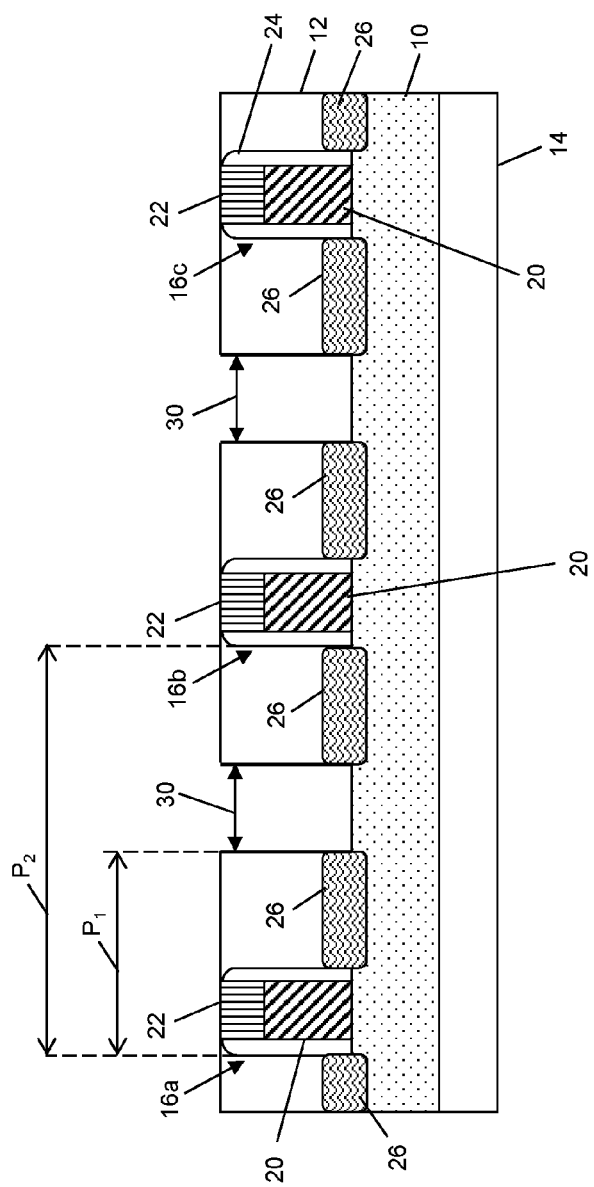
FIG. 2 shows a cross-sectional view of a process for removing dummy gates from the IC structure to form gaps according to embodiments of the present disclosure.

Turning to FIG. 2, processes of the present disclosure can include removing dummy gates 18 not covered by first mask(s) 28 (FIG. 1), e.g., selectively or non-selectively. The term "removing," as used herein, can include any one of various material removal or polishing techniques now known or later developed, including etching. "Etching" generally refers to the removal of material from a substrate (or structures formed on the substrate), and is often performed with a mask (e.g., first mask(s) 28) in place so that material may be selectively removed from a structure, while leaving the remaining material unaffected. There are generally two categories of etching, (i) wet etch and (ii) dry etch. Wet etch is performed with a solvent (such as an acid) which may be chosen for its ability to selectively dissolve a given material (such as polysilicon or amorphous silicon), as may be particularly applicable in further steps discussed herein, while leaving another material (such as insulator materials) relatively intact. The ability to selectively etch particular materials is fundamental to many IC fabrication processes. A wet etch will generally etch a homogeneous material (e.g., a metal) isotropically, but a wet etch may also etch monocrystalline materials (e.g., silicon and/or insulators) anisotropically. Dry etch may be performed using a plasma. Plasma systems can operate in several modes by adjusting the parameters of the plasma. Ordinary plasma etching produces energetic free radicals, neutrally charged, that react at the surface of the wafer. Since neutral particles contact the wafer from all angles, this process is isotropic. Ion milling, or sputter etching, bombards the wafer with energetic ions of noble gases which approach the wafer approximately from one direction, and therefore this process is highly anisotropic. Reactive-ion etching (RIE) operates under conditions intermediate between sputter and plasma etching and may be used to produce deep, narrow features, such as shallow trench isolation (STI) trenches.

Removing dummy gates 18 (FIG. 1) can expose underlying portions of substrate 10 to form gaps 30 positioned between adjacent gate structures (i.e., gate structures 16a, 16b and/or 16b, 16c). Gaps 30, in addition, can be positioned above an upper surface of substrate 10 and thus can be structurally distinct from any insulating materials formed therein. Gaps 30 may separate adjacent doped semiconductor regions 26 from each other. At any point following the removal of dummy gates 18 and the forming of gaps 30, first mask(s) 28 can be removed from the structure such that remaining portions of first insulator 12 and/or portions of gate structures 16a, 16b, 16c become exposed. In any event, the processes described herein can yield an increased pitch $P_2$ between adjacent gate structures 16a, 16b, 16c, greater than that of initial pitch $P_1$. Where each dummy gate 18 is positioned approximately at a midpoint between adjacent gate structures 16a, 16b, 16c, the resulting pitch $P_2$ can be approximately double that of initial pitch $P_1$, and thus can have a value of approximately one-hundred and forty nm. Although initial pitch $P_1$ is no longer applicable to the formed structure after removing dummy gates 18, initial pitch $P_1$ is illustrated in the accompanying FIGS. 2-7 for the sake of comparison. In embodiments of the present disclosure where pitch $P_2$ is double that of initial pitch $P_1$, processes described herein can allow an IC fabricator to increase the pitch by a predictable, predetermined factor.

Figure 3:
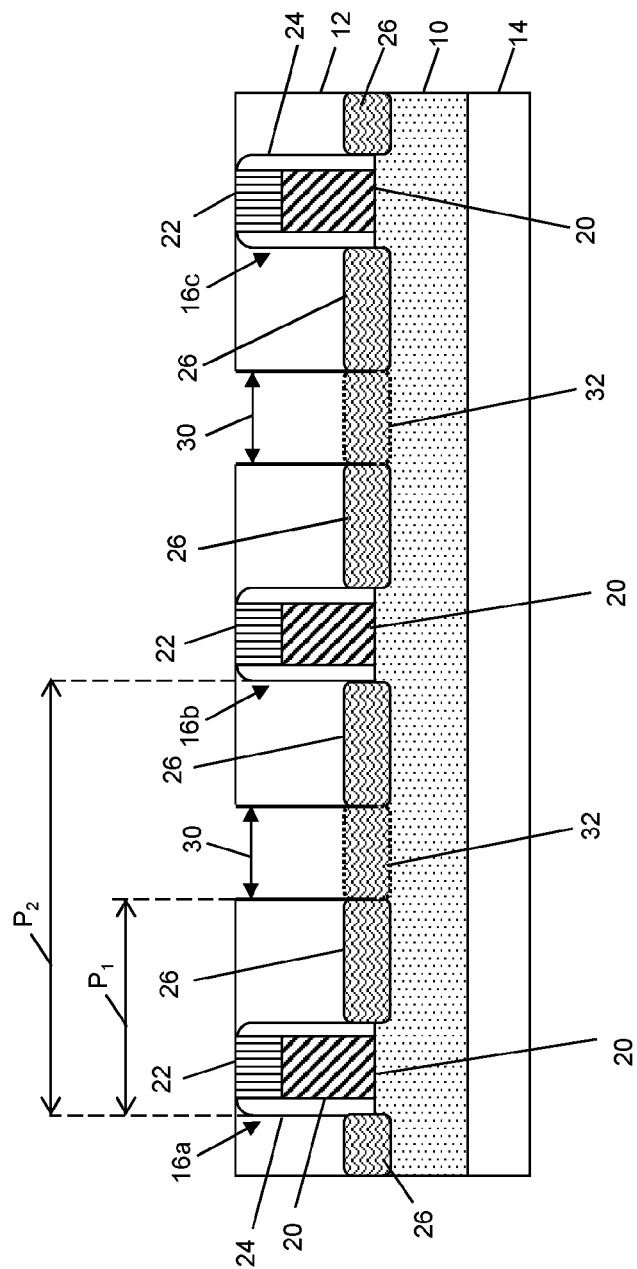
FIG. 3 shows a cross-sectional view of a process of forming additional doped semiconductor regions according to embodiments of the present disclosure.

Referring to FIG. 3, embodiments of the present disclosure can optionally include forming additional structures on substrate 10, e.g., within gap(s) 30 directly between doped semiconductor regions 26. An additional set of doped semiconductor regions 32 can be formed within gap(s) 30, e.g., directly between existing doped semiconductor regions 26. Additional doped semiconductor regions 32 are illustrated in phantom because existing doped semiconductor regions 26 may continue to be separated by gap G (FIG. 2) in some embodiments. It is understood that additional doped semiconductor regions 32 can be composed of the same material or a different material as doped semiconductor regions 26 positioned adjacent to gate structures 16a, 16b, 16c, e.g., Si and/or SiGe with p-type or n-type dopants therein. Doped semiconductor regions 26 formed within gaps 30 can supplant dummy gates 18 (FIGS. 1-2), thereby increasing the pitch between adjacent gate structures 16a, 16b, 16c from the amount of initial pitch $P_1$ to that of pitch $P_2$.

Figure 4:
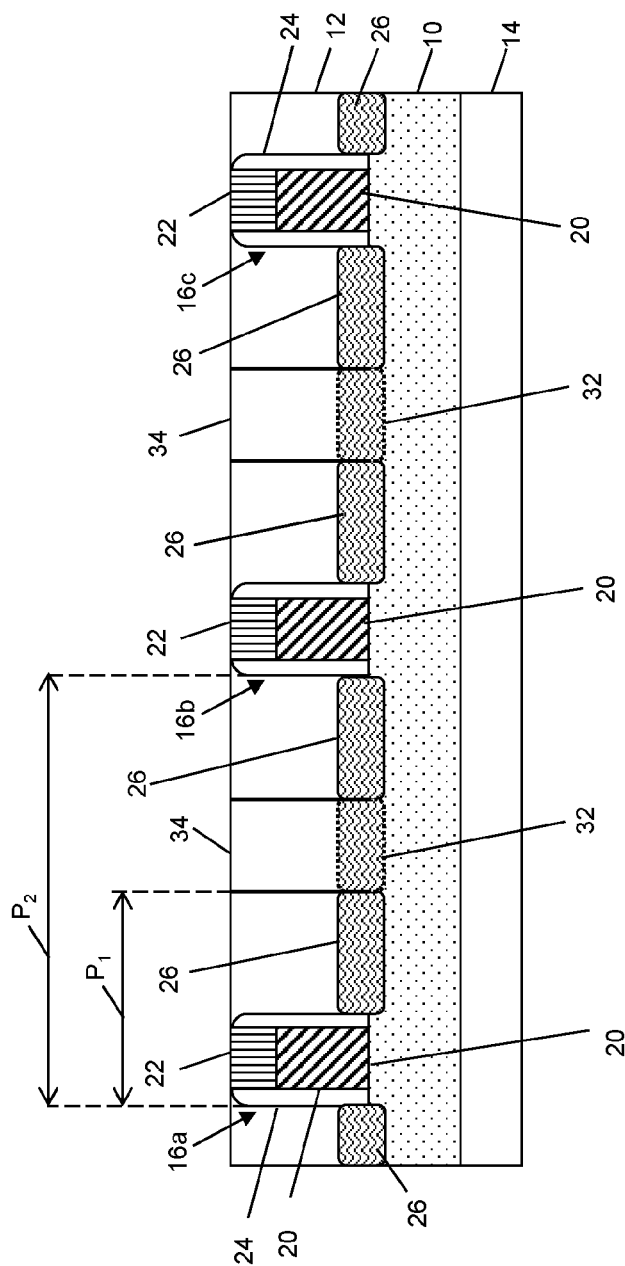
FIG. 4 shows a cross-sectional view of a process for forming an insulator on a doped semiconductor region according to embodiments of the present disclosure.

FIG. 4 illustrates a process of forming additional materials to fill each gap 30 (FIGS. 2-3). Following the removal of dummy gates 18 (FIG. 1) and, optionally, forming doped semiconductor regions 26 within gap(s) 30, methods of the present disclosure can include forming additional materials between each gate structure 16a, 16b, 16c and planarizing the structure. Specifically, a second insulator 34 can be formed within each gap 30, e.g., directly on substrate 10 and/or on the surface of each additional doped semiconductor region 32. Second insulator 34 can be composed of one or more of the same materials used to form first insulator 12, or can be composed of any other currently known or later developed electrically insulative substance such as one or more of the example insulators described herein. Portions of second insulator 34, after being formed, can then be removed or further processed to form an upper surface substantially coplanar with the upper surfaces of each gate structure 16a, 16b, 16c, and first insulator 12. In an example embodiment, second insulator 34 can be polished to produce a planarized upper surface. One type of polishing can include the application of chemical-mechanical polishing (CMP), also known as chemical-mechanical planarization. CMP is a process, using both chemicals and abrasives, comparable to lapping (analogous to sanding), for removing material from a built up structure. For example, after depositing and etching a number of elements, the top surface of the resulting structure may be uneven and in need of smoothing (or leveling), prior to performing a subsequent process step. Generally, CMP will level the high spots of a structure, leaving a relatively smooth planar surface.

Figure 5:
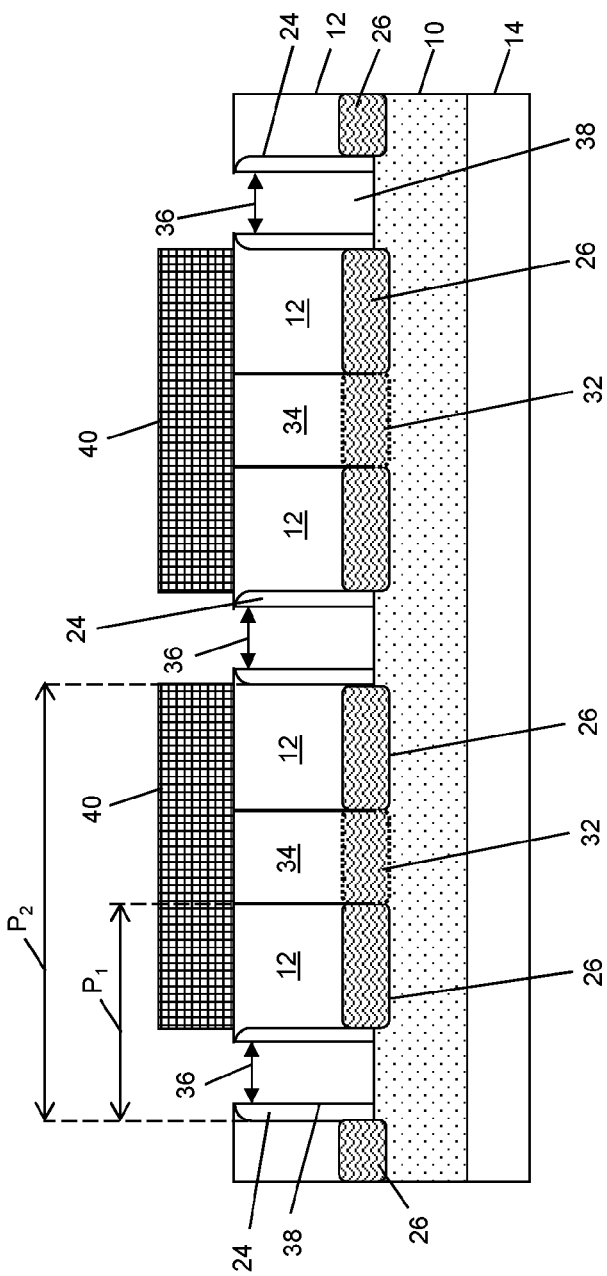
FIG. 5 shows a cross-sectional view of a process for removing gate structures in embodiments of the present disclosure.

Turning to FIG. 5, embodiments of the present disclosure can also include further processing steps performed on one or more gate structures 16a, 16b, 16c, while maintaining the size of pitch $P_2$ therebetween. After the removing of first mask(s) 28 (FIG. 1) and each dummy gate 18 (FIG. 1), embodiments of the present disclosure can include selectively removing one or more of gate structures 16a, 16b, 16c (FIGS. 1-4) to form gate openings 36. Before removing each gate structure 16a, 16b, 16c, a second mask 40 can be formed on an upper surface of first and second insulators 12, 34, which includes openings therein to expose each gate structure 16a, 16b, 16c. Each gate structure 16a, 16b, 16c or portions thereof can be removed, e.g., by removing sacrificial material 20 and insulator caps 22 via a selective or non-selective etching process. A non-selective etching process, such as one or more of the example etching processes described herein, can remove at least insulator caps 22 from each gate structure 16a, 16b, 16c. It is understood that other currently known or later developed selective wet and dry etchants can be applied to remove sacrificial material 20 and/or insulator caps 22. In any event, the presence of second mask 40 can substantially prevent insulators 12, 34 from being removed during the same process for removing of sacrificial material 20 and/or insulator cap 22. In addition, applying a selective etch to sacrificial material 20 can allow spacers 24 to remain intact on substrate 10, to form part of a later-formed structure. The removing of each gate structure 16a, 16b, 16c can form gate openings 36 positioned substantially over substrate 10.

Figure 6:
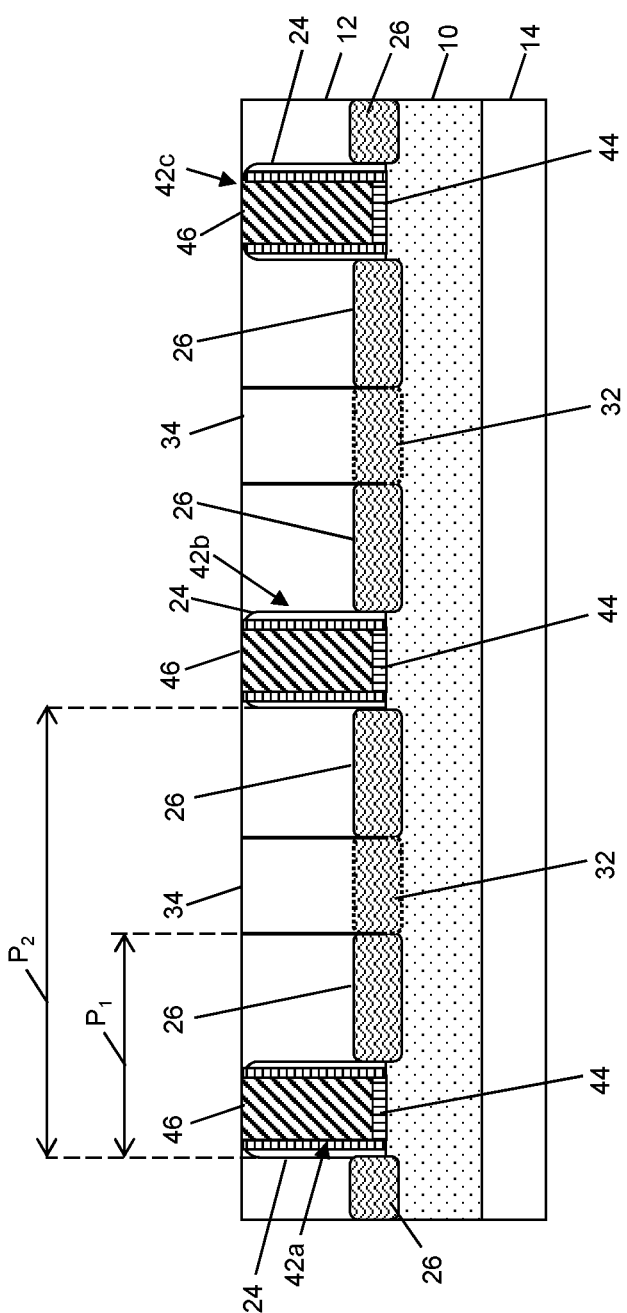
FIG. 6 shows a cross-sectional view of a process of forming replacement metal gates (RMGs) according to embodiments of the present disclosure.

As shown in FIG. 6, further process steps can include forming a set of replacement metal gates (RMGs) 42a, 42b, 42c in each gate opening 36 (FIG. 4). Although first, second, and third RMGs (42a, 42b, 42c, respectively) are shown by example in FIG. 6, it is understood that any conceivable number of RMGs can be fabricated in any number of formed gate openings. Second mask(s) 40, as illustrated in FIGS. 5-6, can be removed immediately following the removal of each gate structure 16a, 16b, 16c (FIGS. 1-4), or can alternatively be removed in a subsequent process step. For example, second masks(s) 40 can remain in place as each RMG 42a, 42b, 42c is formed.

Each RMG 42a, 42b, 42c can include, e.g., a gate dielectric 44 and a gate metal 46 positioned thereon. Gate dielectric 44 can be provided as a thin layer of insulating material formed, e.g., by thermal growth. In an example embodiment, gate dielectric 44 can be provided as a layer of silicon dioxide ($SiO_2$) with or without nitrides being formed within. In some cases, other types of insulators with higher dielectric constants (e.g., hafnium (Hf)-based dielectrics including oxide and/or silicate, and/or other materials having a dielectric constant greater than approximately 7.0) can be used to form gate dielectric 44. Gate metal 46, by contrast, can be composed of one or more electrically conducting materials including without limitation: metals, polysilicon, silicide, etc., formed on gate dielectric 44 by application of deposition and/or one or more other currently known or later-developed processes of forming a material. In any event, gate dielectric 44 and gate metal 46 can be formed as a gate stack structure (i.e., a "metal gate stack") in which gate metal 46 is separated from substrate 10 only by gate dielectric 44. As shown in FIG. 6, portions of gate dielectric 44 can also be positioned laterally between gate metal 46 and spacer 24, e.g., as a result of being formed on spacers 24 in addition to substrate 10. In a process flow of forming RMGs 42a, 42b, 42c, other portions of a transistor structure (e.g., fin, source and drain contacts, channel region, etc.) can be formed as part of a preliminary structure (e.g., structure 10 with gate structures 16a, 16b, 16c (FIGS. 1-4) and dummy gates 18 (FIG. 1) that are later partially or completely replaced with the components of RMGs 42a, 42b, 42c, i.e., gate dielectric 44 and gate metal 46. Thus, the amount of pitch $P_2$ between each adjacent RMG 42a, 42b, 42c can be controlled by the initial processing steps formed on IC structure 10 discussed elsewhere herein.

Figure 7:
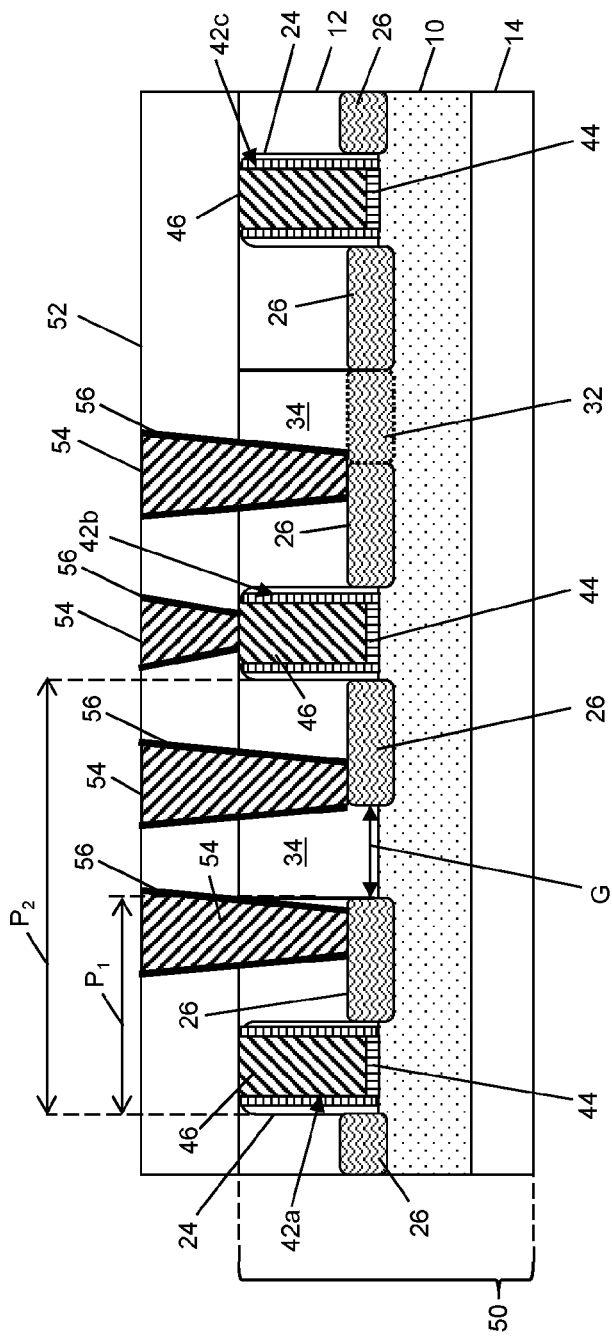
FIG. 7 shows a cross-sectional view of an IC structure according to embodiments of the present disclosure.

Referring to FIG. 7, additional processing steps can provide for the fabrication of an IC structure 50 according to embodiments of the present disclosure. An interlayer dielectric (ILD) 52 can be formed on each of first insulator on each of first insulator 12, second insulator 34, and/or RMGs 42a, 42b, 42c. ILD 52 can physically and electrically separate IC structure 50 from materials formed thereon, e.g., metal level layers formed on IC structure 50 during a back end of line (BEOL) fabrication process. In addition, ILD 52 can be composed of the same insulating materials discussed herein with respect to first and second insulators 12, 34, and/or can include other electrically insulating materials.

Portions of ILD 52, along with underlying portions of first and/or second insulators 12, 34 can then be removed to form additional openings, where one or more contacts 54 can be formed. Each contact 54 can be composed of an electrically conductive metal, e.g., copper (Cu), aluminum (Al), silver (Ag), etc. Contacts 54 can extend through ILD 52 to an upper surface of one or more doped semiconductor regions 26, described elsewhere herein, or an upper surface of one or more gate metals 46 to create a path for electrical current. Where contacts 54 are formed on doped semiconductor regions 26 on opposing sides of one RMG 42a, 42b, 42c, each contact 54 can serve as a terminal to a transistor structure, with contacts to gate metal(s) 46 serving as a gate terminal. Pitch $P_2$ between adjacent RMGs 42a, 42b, 42c, yielded by processes described elsewhere herein, can thereby allow for a larger number of contacts 54 to be formed, and/or can allow for a greater amount of electrical insulation between adjacent transistor gates.

A group of liners 56, including refractory metal compounds such as a tantalum nitride (TaN) and/or tantalum (Ta), can be formed conformally upon sidewalls of each opening within insulators 12, 34 and/or ILD 24 before contacts 54 are formed therein. Other refractory metals such as titanium (Ti), tungsten (W), iridium (Ir), rhodium (Rh) and platinum (Pt), etc., or mixtures of thereof, may also be included in liner 56. In any event, liners 56 can be formed to provide electrical insulation and/or structural protection between adjacent contacts 54 and/or other materials.

Embodiments of the various processes described herein can yield IC structure 50 according to embodiments of the present disclosure. IC structure 50 can be distinguished from conventionally formed, adjacent RMGs 42a, 42b, 42c on the basis of pitch $P_2$ being greater than initial pitch $P_1$ (e.g., doubled), or on the basis of additional structural features described herein. As shown in FIG. 7, two doped semiconductor regions 26 (e.g., positioned between first and second RMGs 42a, 42b) can be laterally separated from each other by a gap G, also positioned over substrate 10. Gap G is generally identified as such based on the absence of electrically conductive and/or semiconductor materials therein. For example, gap G can be wholly or partially filled with additional doped semiconductor region 32, first or second insulators 12, 34 therein, and/or can be filled with other insulating materials such as a gas dielectric region. Portions of second insulator 34 can thus be positioned within and over gap G to provide a region of electrical insulation laterally positioned between RMGs 42a, 42b, 42c. Second insulator 34 can thus be positioned directly on substrate 10, and laterally between portions of insulator 12 positioned directly on each doped semiconductor region 26 such that a portion of second insulator 34 is positioned within gap G. A lateral width of gap G can be substantially equal to the initial with of dummy gate(s) 18 (FIG. 1), because of being formed in the same location. In some embodiments, additional doped semiconductor regions 32 (shown in phantom) can be formed within gap G in optional process steps described herein and as illustrated in FIG. 3. It is also understood that other types of electrically insulating materials (e.g., other types of dielectrics) can be for med within gap G between adjacent doped semiconductor regions 26 to electrically separate adjacent transistor structures.

IC structure 50 can also include, e.g., two or more contacts 54 positioned between adjacent RMGs 42a, 42b, because of the increased amount of pitch yielded in embodiments of the processing steps described herein. For example, doped semiconductor region 26 positioned directly adjacent to first RMG 42a can include one contact 54 thereon, while another semiconductor region 26 positioned directly adjacent to second RMG 42b can have a corresponding contact 54 positioned thereon. Each contact 54 can be separated from each other by first and/or second insulators 12, 34 within gap G. As a result, two or more contacts 54 can be positioned laterally between adjacent RMGs 42a, 42b (and/or RMGs 42b, 42c where applicable). It is understood that IC structure 50 in embodiments of the present disclosure can include a greater number of contacts 54 positioned between laterally adjacent RMGs 42a, 42b, 42c as compared to conventionally formed RMGs, e.g., because gap G is positioned between adjacent doped semiconductor regions 26.

The resulting IC structures described herein can be distributed by the fabricator in raw wafer form (that is, as a single wafer that has multiple unpackaged chips), as a bare die, or in a packaged form. In the latter case the chip is mounted in a single chip package (such as a plastic carrier, with leads that are affixed to a motherboard or other higher level carrier) or in a multichip package (such as a ceramic carrier that has either or both surface interconnections or buried interconnections). In any case the chip is then integrated with other chips, discrete circuit elements, and/or other signal processing devices as part of either (a) an intermediate product, such as a motherboard, or (b) an end product. The end product can be any product that includes integrated circuit chips, ranging from toys and other low-end applications to advanced computer products having a display, a keyboard or other input device, and a central processor.

The terminology used herein is for the purpose of describing particular embodiments only and is not intended to be limiting of the disclosure. As used herein, the singular forms "a," "an," and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof.

The corresponding structures, materials, acts, and equivalents of all means or step plus function elements in the claims below are intended to include any structure, material, or act for performing the function in combination with other claimed elements as specifically claimed. The description of the present disclosure has been presented for purposes of illustration and description, but is not intended to be exhaustive or limited to the disclosure in the form disclosed. Many modifications and variations will be apparent to those of ordinary skill in the art without departing from the scope and spirit of the disclosure. The embodiments were chosen and described in order to best explain the principles of the disclosure and the practical application, and to enable others of ordinary skill in the art to understand the disclosure for various embodiments with various modifications as are suited to the particular use contemplated.

We claim:

1. A method for increasing a pitch between gates, the method comprising:
   providing an IC structure including:
      a first gate structure and a second gate structure each positioned on a substrate, and
      a dummy gate positioned between the first and second gate structures, wherein a dielectric layer laterally separates the first gate structure and the second gate structure from the dummy gate, and wherein the dummy gate includes a pair of dummy gate spacers positioned on opposing sidewalls thereof;
   forming a mask over the first and second gate structures;
   selectively etching the dummy gate from the IC structure to expose a portion of the substrate underneath the dummy gate of the IC structure, without affecting the first and second gate structures, the selectively etching including removing the dummy gate spacers; and
   forming a doped semiconductor region on the exposed portion of the substrate.

2. The method of claim 1, further comprising:
   forming an insulator on the doped semiconductor region; and
   planarizing the formed insulator such that an upper surface of the planarized insulator is substantially coplanar with an upper surface of the first gate structure and an upper surface of the second gate structure.

3. The method of claim 1, further comprising:
   removing the mask after the selective removing of the dummy gate;
   removing one of the first gate structure and the second gate structure to yield a gate opening within the dielectric layer; and
   forming a replacement metal gate (RMG) in the gate opening within the dielectric layer.

4. The method of claim 1, wherein the IC structure further includes:
   a first doped semiconductor region positioned on a portion of the substrate positioned between the first gate structure and the dummy gate, and
   a second doped semiconductor region positioned on the portion of the substrate positioned between the second gate structure and the dummy gate.

5. The method of claim 4, further comprising forming at least one contact to one of the first and second doped semiconductor regions.

6. The method of claim 4, further comprising forming a gap-filling dielectric over the exposed portion of the substrate, wherein a portion of the gap-filling dielectric is positioned laterally between the first and second doped semiconductor regions.

7. The method of claim 1, wherein each of the first and second gates includes a sacrificial material positioned on the substrate, and an insulator cap positioned on the sacrificial material.

8. The method of claim 1, further comprising, after the selective removing of the dummy gate structure:
removing the mask to expose the first and second gates;
removing the first gate structure to yield a first gate opening within the dielectric layer;
removing the second gate structure to yield a second gate opening within the dielectric layer;
forming a first replacement metal gate (RMG) on the first gate opening within the dielectric layer; and
forming a second RMG on the second gate opening within the dielectric layer.

9. The method of claim 1, wherein the dummy gate includes one of polysilicon and amorphous silicon, and wherein the selective etching of the dummy gate includes wet etching with a material selective to polysilicon or amorphous silicon.

10. A method for increasing a pitch between gates, the method comprising:
forming a first gate, a second gate, and a dummy gate on a substrate, wherein the dummy gate is positioned laterally between the first and second gates, and wherein the dummy gate includes a pair of dummy gate spacers positioned on opposing sidewalls thereof;
forming a first insulator over the substrate;
selectively etching the dummy gate to form a gap, the selectively etching including removing the dummy gate spacers;
filling the gap with a second insulator;
planarizing the first and second insulators such that an upper surface of each of the planarized first and second insulators is substantially coplanar with an upper surface of the first gate and an upper surface of the second gate;
selectively removing the first gate and the second gate from a first gate opening and a second gate opening within the first insulator;
forming a first replacement metal gate (RMG) on the first gate opening of the substrate; and
forming a second RMG on the second gate opening of the substrate, wherein the gap is positioned laterally between the first RMG and the second RMG.

11. The method of claim 10, further comprising forming a set of sidewall spacers on each of the first gate and the second gate before the forming of the first insulator.

12. The method of claim 10, further comprising, before the forming of the first insulator:
forming a first doped semiconductor region between the first gate and the dummy gate; and
forming a second doped semiconductor region between the dummy gate and the second gate.

13. The method of claim 10, wherein the dummy gate includes one of polysilicon and amorphous silicon, and wherein the selective etching of the dummy gate includes wet etching with a material selective to polysilicon or amorphous silicon.

14. The method of claim 10, wherein each of the first and second gates includes a sacrificial material positioned on the substrate, and an insulator cap positioned on the sacrificial material.

15. The method of claim 10, after the selectively etching the dummy gate and prior to the filling the gap with the second insulator,
forming a doped semiconductor region within the gap, wherein the filling of the gap includes filling the gap with the second insulator over the doped semiconductor region therein.

16. A method for increasing a pitch between gates, the method comprising:
providing an IC structure including:
a first gate structure and a second gate structure each positioned on a substrate, and
a dummy gate positioned between the first and second gate structures, wherein a dielectric layer laterally separates the first gate structure and the second gate structure from the dummy gate;
forming a mask over the first and second gate structures;
selectively etching the dummy gate from the IC structure to expose a portion of the substrate underneath the dummy gate of the IC structure, without affecting the first and second gate structures;
forming a doped semiconductor region over the exposed portion of the substrate; and
forming a gap-filling dielectric over the exposed portion of the substrate.

17. The method of claim 16, further comprising, after the selective etching of the dummy gate structure:
removing the mask to expose the first and second gate structures;
removing the first gate structure to yield a first gate opening within the dielectric layer;
removing the second gate structure to yield a second gate opening within the dielectric layer;
forming a first replacement metal gate (RMG) on the first gate opening within the dielectric layer; and
forming a second RMG on the second gate opening within the dielectric layer.

18. The method of claim 16, further comprising, before the forming of the first insulator:
forming a first doped semiconductor region between the first gate and the dummy gate; and
forming a second doped semiconductor region between the dummy gate and the second gate.

* * * * *